United States Patent
Greco et al.

[11] Patent Number: 5,928,960
[45] Date of Patent: *Jul. 27, 1999

[54] PROCESS FOR REDUCING PATTERN FACTOR EFFECTS IN CMP PLANARIZATION

[75] Inventors: Nancy Anne Greco; Stephen Edward Greco, both of LaGrangeville, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/738,506

[22] Filed: Oct. 24, 1996

[51] Int. Cl.$^6$ ..................................................... H01L 21/00
[52] U.S. Cl. .......................... 438/692; 438/626; 438/633; 438/697; 216/38; 216/57; 216/89
[58] Field of Search .................................. 216/38, 57, 88, 216/89; 438/692, 697, 734, 631, 626, 633

[56] References Cited

U.S. PATENT DOCUMENTS

| | | | |
|---|---|---|---|
| 4,007,103 | 2/1977 | Baker et al. | 204/192 |
| 5,104,828 | 4/1992 | Morimoto et al. | 438/633 |
| 5,139,608 | 8/1992 | Grivna | 438/697 |
| 5,310,626 | 5/1994 | Fernandes et al. | 430/327 |
| 5,328,553 | 7/1994 | Poon | 438/692 |
| 5,332,467 | 7/1994 | Sune et al. | 438/633 |
| 5,395,801 | 3/1995 | Doan et al. | 438/692 |
| 5,437,763 | 8/1995 | Huang | 216/18 |
| 5,502,007 | 3/1996 | Murase | 438/633 |
| 5,580,826 | 12/1996 | Matsubara | 438/631 |
| 5,663,107 | 9/1997 | Peschke et al. | 438/692 |

Primary Examiner—Janis L. Dote
Attorney, Agent, or Firm—Schmeiser, Olsen & Watts; Jay Anderson

[57] ABSTRACT

According to the present invention, an improved method for planarizing the surface of a dielectric or metal layer in an integrated circuit manufacturing process is disclosed. The dielectric or metal layer to be planarized is selectively patterned and etched over different regions of the surface. The size, shape, density, and depth of the patterns are determined by the pattern factor of the integrated circuit structures underlying the layer to be planarized. Further, by using the pattern factor of the underlying structures to determine the density, size, depth and placement of the surface pattern, the overall planarization process can be improved. Other empirically determined factors, such as material strength, CMP slurry temperature, and pad pressure can also be used to further refine the CMP process. By varying the pattern over the entire surface of the layer to be planarized, the CMP material removal rate can be controlled to achieve a more planar surface.

2 Claims, 4 Drawing Sheets

PROCESS FOR REDUCING PATTERN FACTOR EFFECTS IN CMP PLANARIZATION

BACKGROUND OF THE INVENTION

1. Technical Field

This invention generally relates to the field of semiconductor processing and integrated circuit manufacturing. More specifically, the present invention relates to planarizing semiconductor wafer surfaces.

2. Background Art

Today, our society is heavily dependant on hightech electronic devices for everyday activity. Integrated circuits are the components that give life to our electronic devices. Integrated circuits are found in widespread use throughout our country, in appliances, in televisions and personal computers, and even in automobiles. Additionally, modern manufacturing and production facilities are becoming increasingly dependant on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices.

The traditional integrated circuit fabrication process is a series of steps by which a geometric pattern or set of geometric patterns is transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers.

Integrated circuits are chemically and physically integrated into a substrate material, such as a silicon or gallium arsenide wafer, by combining electrically conductive, semiconductive, and dielectric (insulating) layers or regions. The layers and regions are arranged to form electronic components or devices such as transistors, diodes, and capacitors. Thousands of these devices are formed essentially simultaneously on the surface of a single wafer of semiconductor material during processing.

Throughout the evolution of integrated circuit manufacturing, integrated circuit designers have had two main objectives: (1) to increase integrated circuit performance (mainly by increasing circuit speed) and (2) to increase the functional complexity of the integrated circuits. From the beginning, reducing the physical size of the individual integrated circuit components was a very effective means of achieving both of these goals. Eventually, the reduction in the size of the integrated circuit devices became somewhat limited by secondary factors including the physical logistics and characteristics of the electrical connections joining the various integrated circuit components. In addition, certain aspects of silicon utilization, chip manufacturing costs, and ease of flexibility for integrated circuit design were also adversely affected by electrical interconnect technology restrictions. The approaches taken to overcoming these obstacles have resulted in the present day design practice of vertical stacking or integration of devices and their associated electrical interconnections, commonly known as multilevel-interconnect schemes. By stacking components vertically, one above the other on different layers, connecting the relatively small individual components is less problematic.

For example, in a typical fabrication process, a layer of aluminum or some other metal is deposited on the surface of the wafer substrate. The metal layer is patterned to form interconnect paths along the surface of the wafer substrate. In most processes, an insulating or dielectric layer is then deposited over the first metal layer. Via openings, or holes, are then created in the dielectric layer and a second metal layer is deposited over the dielectric layer. The second metal layer covers the intervening dielectric layer and fills the via openings in the dielectric layer down to the first metal layer. These filled via openings provide electrical connections between the first and second metal layers. The second metal layer is also patterned to form additional circuit devices and paths. The dielectric layer acts as an insulator between the first and second metal layer.

Typically, the dielectric layer is a layer of silicon dioxide formed by a chemical vapor deposition (CVD) process. The silicon dioxide layer normally has a thickness of approximately one micron. The underlying metal layer is also approximately one micron thick. The silicon dioxide layer covers the metal layer and generally conforms to the topology of the underlying layer. This means that the silicon dioxide layer, after deposition, is characterized by a series of relatively uneven, non-planar steps which generally conform in height and width to the features of the underlying metal layer. This phenomena is known as "pattern factor effect." Each structure used in integrated circuit design has a pattern factor number associated with it that characterizes the pattern factor effect. The pattern factor number of a given structure describes how much of the surface area covered by a given structure is made of metal. For example, if a given structure has a pattern factor of 0.5, that means that the surface area of the wafer covered by the structure is approximately 50% metal. One specific example of a metal structure with a pattern factor number of 0.5 or 50% is known as a "maze." In a typical semiconductor design, there will be multiple metal structures with a wide variety of pattern factor numbers. In addition, as the number of layers increases, the overall unevenness of the surface may be exacerbated by stacking multiple metal structures on top of each other in subsequent layers.

Since the overall process of forming integrated circuits on the surface of wafers is heavily dependant on photo processing techniques such as photolithography, it is imperative that the surface of the wafer be as flat, or planar as possible. This is necessary so that the entire wafer surface is the same distance from the lenses used in photolithography. If the surface of the wafer is not extremely planar, different regions of the surface may be "out of focus." This means that the necessary high resolution patterns cannot be accurately printed on the surface of the wafer and the resulting circuit patterns will not be well defined. This, in turn, frequently produces inoperable circuits on the wafer, thereby reducing yield. To alleviate these problems, the surface of the wafer is typically "planarized" or smoothed off at various stages in the manufacturing process. As additional levels are added to multilevel-interconnection schemes and integrated circuit features are scaled down to submicron dimensions, the required degree of planarization increases. Planarization can be performed on either the metal layers, the dielectric layers, or both.

One method used to provide wafer surface planarity in a dielectric layer includes forming an oxide layer using a material such as borophosphosilicate glass (BPSG) on a wafer surface, then heating the wafer to melt the BPSG and thereby planarize the oxide layer. This technique is commonly referred to as "reflow" and was an effective means of planarizing integrated circuit wafers with comparatively large device geometries. However, as improved semiconductor manufacturing technology allowed for smaller integrated circuit device sizes, reflow methods produced unsatisfactory degrees of planarization.

Most recently, chemical mechanical polishing (CMP) processes have been used to planarize the surface of a wafer during the device fabrication process. The typical CMP process involves holding a thin, flat wafer of semiconductor material against a rotating, wetted, polishing pad surface under controlled surface pressure. A polishing slurry, such as a mixture of either a basic or an acidic solution, is used as a chemical etch component in combination with alumina or silica particles. A rotating polishing head or wafer carrier is generally used to hold the wafer under controlled pressure against a rotating polishing platen. The polishing platen is usually covered with a polishing pad, made from a material such as polyurethane. The CMP process employs both chemical and mechanical processes to remove unwanted material from the surface of the wafer. In one aspect, the liquid portion of the slurry chemically depletes, loosens, or modifies the composition of the material on the wafer which is to be removed. Then, the particles or grit within the slurry, in combination with the rotating polishing pad, physically remove the chemically modified material from the wafer.

The effectiveness of the CMP process to achieve a planar surface is dependant, at least in part, upon its ability to remove material from the undesired high spots on the surface of the wafer faster than the low spots, a characteristic which is commonly referred to as CMP "selectivity." CMP selectivity is typically defined as the ratio of the high area removal rate compared to the low area removal rate. For dielectric materials, it is generally preferred to have CMP selectivity as high as possible. A very high selectivity ratio indicates that only unwanted dielectric material is being removed from the surface of the wafer. A high selectivity ratio is desirable because it allows a thinner oxide layer to be deposited over the surface of the wafer. If the selectivity ratio is low, then a relatively thicker layer of oxide must be deposited to prevent the undesired exposing of the underlying metal layer during the CMP planarization process.

While CMP processing can greatly improve the overall planarity of the wafer surface, the amount of polishing that takes place in a given location is also highly dependant on the underlying topology. As mentioned above, the different types of structures underlying the metal or oxide layer will often have different pattern factors and the surface of the upper layer will generally conform to the physical topology of the underlying layer. The slurry compounds used in most CMP processes will generally polish different areas of the upper layer at different rates, based partially on the pattern factor of the underlying structures. The variations in surface planarity alter the amount of pad pressure over the surface of the layer being polished. This variation in pad pressure can contribute to an uneven polishing rate that will create non-planar surfaces. For example, the area of an oxide layer deposited over an isolated metal line will polish faster than the area of the same oxide layer which is deposited over a wide or large area metal pad.

This means that with a typical dielectric layer deposited over a patterned metal layer, in those areas where a narrow interconnect line (on the order of 1 microns) with a relatively low pattern factor runs across a wide field region (on the order of 1–10 mm), the planarized dielectric can become dramatically thinned from the CMP process as compared to those regions where the metal width is considerably wider (e.g. 50–10 microns) and has a relatively higher pattern factor. In addition, a complex metal structure with a number of very thin lines spaced closely together may have a relatively high pattern factor. In some instances, thinning of the dielectric layer can reach a point where the underlying metal layer becomes exposed and circuit failure results. Further, the thickness of the oxide layer will vary significantly based on the type of metal structure underlying the oxide layer and this may also inhibit uniform and effective planarization of the oxide layer.

When planarizing a metal layer, the nature of the problem is slightly different. When the CMP process is applied to the surface of a metal layer deposited over a patterned oxide layer, the areas of the metal layer deposited over oxides structures with a relatively higher pattern factor tend to polish slower than the areas of the metal layer where the underlying oxide structures have a lower pattern factor. This phenomena is know as "dishing." If the dishing is severe enough, then too much of the metal layer may actually be polished away in certain spots, once again resulting in circuit failure. Therefore, even when planarizing a metal layer, CMP rate and selectivity are still critical factors.

One method used for controlling the CMP process to provide more planar wafer surfaces is to place nitride, amorphous carbon, or some other material which is relatively resistant to the CMP process over portions of the oxide layer. This material typically has a relatively high dielectric constant and is known as a "polish stop." When the oxide layer has been planarized to the level of the polish stop, the CMP process is slowed. A polish stop will, theoretically, prevent the removal of the oxide layer beneath the polish stop material. By placing polish stops at appropriate locations on the wafer, a relatively planar surface can be achieved. However, the inclusion of carbon or other polish stop materials in the wafer can have adverse effects on the dielectric capabilities and capacitance of the oxide layer, especially in certain high frequency integrated circuit designs. This makes the use of polish stops unsuitable for many applications. In addition, the polish stop may not actually prevent oxide removal but may only slow the CMP process temporarily. If the surface of the polish stop is exposed to the CMP process long enough, it will eventually break down and wear through.

As the dimensions of the circuits become smaller, and the number of layers used in creating an integrated circuit wafer increase, the problem with consistent, controllable CMP planarization rates has become more critical. Now that submicron dimensions are typical for integrated circuit devices, and six or more layers of deposited materials on integrated circuit wafers are common, prior planarization methods are increasingly inadequate and significantly hinder further advances in integrated circuit manufacturing. In addition, the nature of the oxides used in integrated circuit manufacturing have evolved and changed significantly in the past few years. These changes have also reduced the effectiveness of existing planarization techniques.

Therefore, there exists a need to provide an improved method of CMP planarization for integrated circuit manufacturing to eliminate non-planar surficial height variations due to the underlying topography of the wafer layers. This improved method of CMP planarization should be more controllable than previous methods and should be adaptable to both the metal and dielectric layers of an integrated circuit wafer. Without additional improvements in CMP processing techniques, further advances in designing and manufacturing complex, multi-layer integrated circuits may be difficult to obtain.

DISCLOSURE OF INVENTION

According to the present invention, an improved method for planarizing the surface of a dielectric or metal layer in an integrated circuit manufacturing process is disclosed. The dielectric or metal layer to be planarized is selectively patterned and etched over different regions of the surface. In general, the patterns are denser and more material is etched away over those areas of the wafer's surface where a higher rate of material removal is desired and less dense over areas of the wafer's surface where a lower material removal rate is desired. By creating islands of isolated oxide or metal in certain areas, the CMP rate can be altered in those areas. Further, by using the pattern factor of the underlying structures to determine the density, size, depth and placement of the surface pattern, the overall planarization process can be improved.

In effect, by selectively patterning and etching the surface of the upper oxide or metal layer based on the pattern factor of the structure underlying the oxide or metal layer, a more controlled CMP planarization rate can be achieved over the entire surface of the wafer. This, in turn, means that a more uniformly planar surface can be achieved during the integrated circuit manufacturing process. While the method of the present invention may be accomplished for each deposited layer of the integrated circuit wafer individually, it is also possible to practice the invention in other ways. For example, multiple layers can be deposited without planarizing each layer and then the topmost layer only may be planarized to account for the accumulated pattern factor effect of the multiple unplanarized layers. Existing data on polish rates for various types of oxide and metal structures can be combined with other empirical test results to quantize the optimal type of pattern to be applied for specific structures with specific pattern factor numbers. In addition, other empirically determined factors, such as the material strength of the layer, CMP slurry temperature, and pad pressure can also be used in conjunction with the present invention to further refine the CMP process.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

According to the present invention, an improved method for planarizing the surface of a layered semiconductor chip is disclosed. The method of the present invention may be used to planarize either a dielectric layer or a metal layer. The uppermost layer of the semiconductor wafer is etched or patterned according to the pattern factor of the underlying structures in the layers beneath the uppermost layer. Further, by using the pattern factor of the underlying structures to determine the density, size, depth and placement of the surface pattern, the overall planarization process can be improved. A preferred embodiment of the present invention for planarizing a dielectric layer and for planarizing a metal layer are described separately in the description that follows. It should be noted that the figures as described below represent only a small portion of the surface of a semiconductor wafer. Additional structures and layers, although not shown, may be present on the surface of the semiconductor wafer as depicted in FIGS. 1–12.

Figure 1:
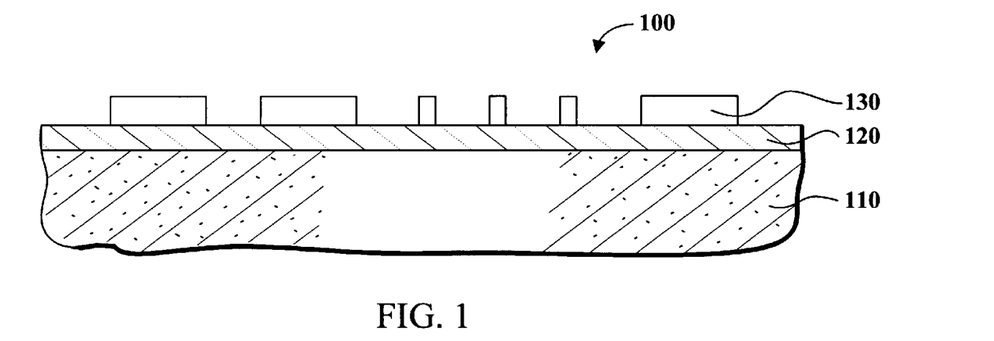
FIG. 1 is a side view of a semiconductor wafer ready for use with a preferred embodiment of the method of the present invention for planarizing an oxide layer on the semiconductor wafer.

Referring now to FIG. 1, a wafer structure 100 used for fabricating integrated circuits according to a first preferred embodiment of the method of the present invention includes: substrate 110; insulative layer 120; and a patterned metallic layer 130. Wafer structure 100 is a portion of an integrated circuit chip. Wafer structure 100 may be formed by using any of the integrated circuit fabrication methods or techniques known to those skilled in the art.

Substrate 110 is any substrate used to manufacture integrated circuits such as silicon, gallium arsenide, etc. Substrate 110 will typically contain integrated circuit components such as P-well and N-well transistor gates and many other circuit components (not shown) which are well known to those skilled in the art. Insulative layer 120 is typically a layer of silicon dioxide material formed by depositing silicon dioxide, High Density Plasma (HDP) oxide, silicon nitride, aluminum oxide or other similar material on the surface of substrate 110 using chemical vapor deposition (CVD), Plasma Enhanced CVD (PECVD), sputtering or re-sputtering processes. Insulative layer 120 is a dielectric material and acts to passivate or protect substrate 110 as well as to electrically isolate substrate 110 from patterned metallic layer 130.

Patterned metallic layer 130 is formed by any integrated circuit fabrication process or methods now known or hereafter developed. Presently known methods for creating patterned metallic layer 130 include, for example, photolithographic etching with a reactive ion etch process or lift-off techniques. Patterned metallic layer 130 is selectively connected to devices (not shown) at the surface of substrate 110 by connectors (not shown). Patterned metallic layer 130 may be any metal used in integrated circuit fabrication processes now or in the future. This would include, for example, aluminum, aluminum-copper alloys, platinum, palladium, chromium, or molybdenum. Patterned metallic layer 130 is typically used to connect multiple devices and layers in an integrated circuit.

Figure 2:
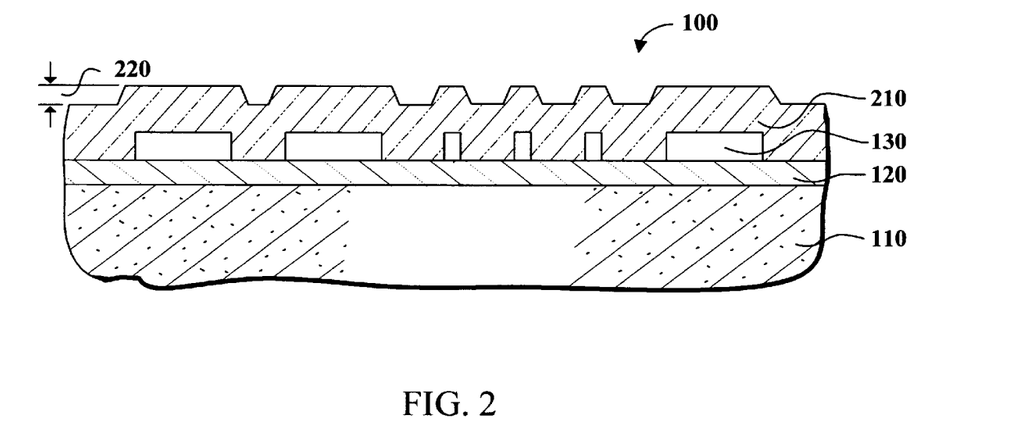
FIG. 2 is a side view of the semiconductor wafer of FIG. 1 with a dielectric material deposited on the surface.

Referring now to FIG. 2, wafer structure 100 of FIG. 1 is shown with an insulative layer 210 deposited over previously deposited insulative layer 120 and patterned metallic layer 130. Insulative layer 210 is typically silicon dioxide or a doped silicon oxide layer but may be formed from any material suitable to insulate patterned metallic layer 130 from subsequently deposited layers. Insulative layer 210 may be formed by any process, method, or technique known in the integrated circuit manufacturing art. Typically, insulative layer 210 is formed by plasma enhanced deposition processes. As shown in FIG. 2, the deposition of insulative layer 210 has created a non-planar surface on wafer structure 100 as indicated by a distance 220. Note that the non-planarity of the surface of insulative layer 210 is exaggerated for purposes of illustration. Distance 220 represents the difference between a lower area of the surface of insulative layer 210 and a higher area of insulative layer 210. The actual thickness of distance 220 will vary significantly based on a number of factors. For example, depending on the actual deposition techniques employed and the thickness of patterned metallic layer 130, distance 220 may range anywhere from 1,000 angstroms to 7,000 angstroms or more. As explained above, this uneven, non-planar surface may disrupt further fabrication processing steps if the surface of insulative layer 210 is not planarized. In addition, if the surface of insulative layer 210 were to be polished by a typical CMP process at this point, the oxide areas over the narrow metal lines would polish more quickly than the oxide areas over the thicker metal lines.

Figure 3:
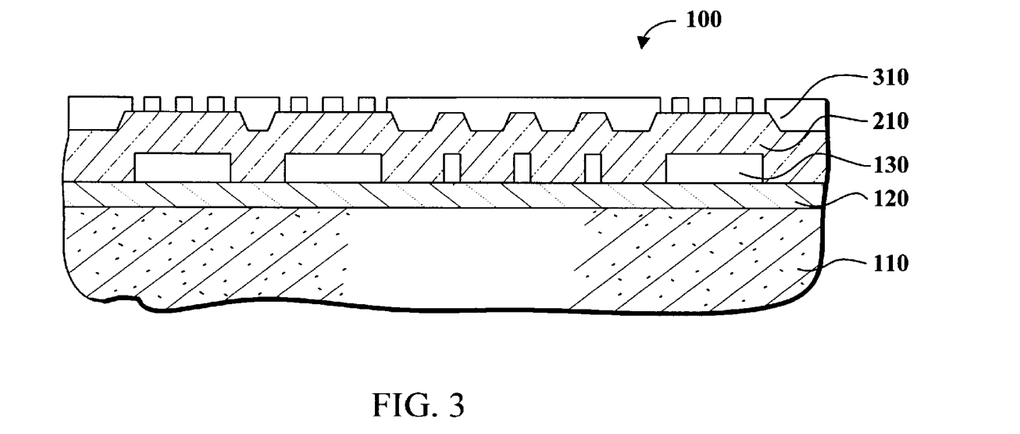
FIG. 3 is a side view of the semiconductor wafer of FIG. 2 with a patterned photo-resist material deposited on the surface.

Referring now to FIG. 3, wafer structure 100 of FIG. 2 is shown with a photoresist layer 310 deposited over the surface of previously deposited insulative layer 120, patterned metallic layer 130, and insulative layer 210. Photoresist layer 310 may be formed or deposited using any method known to those skilled in the art. The photoresist materials and deposition processes vary significantly among the different manufacturers of integrated circuits. The method of the present invention is compatible with all current photoresist materials and deposition processes. The composition of photoresist layer 310 will be determined by the integrated circuit manufacturer, the integrated circuit fabrication process selected, and the type of integrated circuit devices being manufactured. After deposition, photoresist layer 310 has been patterned according to the pattern factor of the metal structures underlying insulative layer 210. The size, depth, number, and placement of the elements of the pattern developed in photoresist layer 310 is determined by the pattern factor of the underlying structures defined by patterned metallic layer 130. Photoresist layer 310 may be deposited and patterned by any method known to those skilled in the art.

Figure 4:
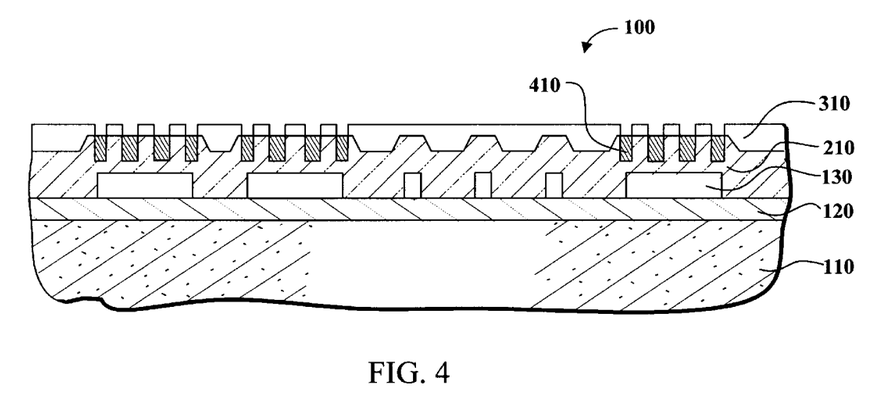
FIG. 4 is a side view of the semiconductor wafer of FIG. 3 prepared with a reactive ion etch.

Referring now to FIG. 4, wafer structure 100 of FIG. 3 is shown with layer insulative layer 210 being exposed in certain areas 410 to an etching process. The etching process removes portions of insulative layer 210 which are not masked by photoresist layer 310. Areas 410 not protected by patterned photoresist layer 310 will become the openings in insulative layer 210 which will alter the CMP polishing rates later in the fabrication process. While the etching process is typically a reactive ion etching process, the actual etching process used may be any integrated circuit fabrication or manufacturing etching process known to those skilled in the art. This would include laser etching, etc. In addition, the type of etching process used will also depend on the processes used by the manufacturer and the type of material used in forming photoresist layer 310. The duration of the etch process will be determined by the amount of material to be removed from the surface of oxide layer 210.

Figure 5:
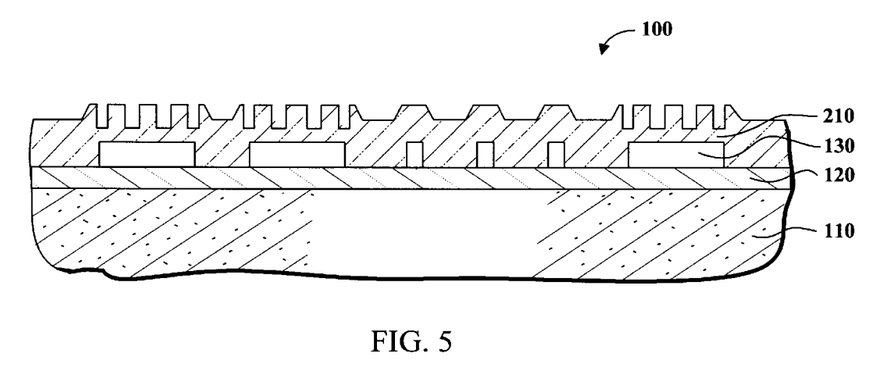
FIG. 5 is a side view of the semiconductor wafer of FIG. 4 with the photo-resist material stripped away.

Referring now to FIG. 5, wafer structure 100 of FIG. 4 is shown with the surface of insulative layer 210 patterned and ready for the actual CMP planarization process. In FIG. 5, the portions of photoresist layer 310 not previously removed by the patterning described above in conjunction with FIG. 3 have been removed by using an oxygen strip or solvent process. At this point in the process, photoresist layer 310 has been completely removed from the surface of insulative layer 210. The remaining portions of insulative layer 210 have been patterned according to the pattern factor of the underlying metal structures as defined in patterned metallic layer 130. Wafer structure 100 is now prepared to be processed by the CMP planarization method described earlier.

As shown in FIG. 5, a greater number of openings in the overlying insulative layer 210 above the relatively wider width metal structures are etched than the number of openings etched in the overlying insulative layer 210 above the relatively narrower width metal structures.

Figure 6:
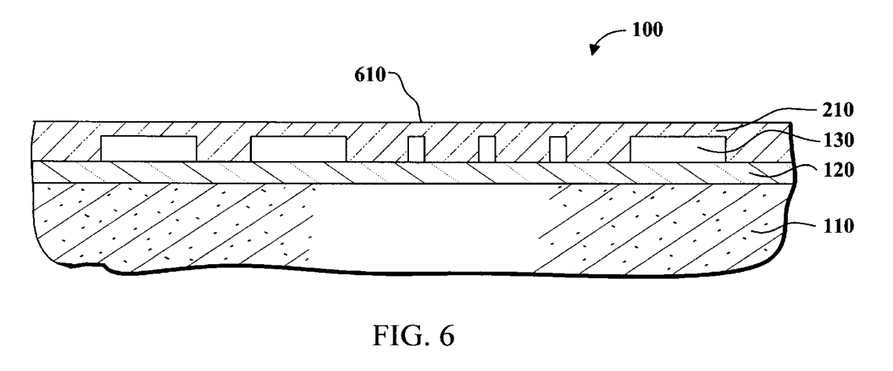
FIG. 6 is a side view of the semiconductor wafer of FIG. 5 after undergoing a CMP process.

Referring now to FIG. 6, wafer structure 100 of FIG. 5 is shown after the CMP planarizing process has been performed on insulative layer 210. The CMP planarization process has produced planar surface 610. The CMP process is any typical CMP process known to those skilled in the art. In addition, any of the techniques for controlling the planarization rates of the CMP process and the selectivity of the CMP planarization process may be used in conjunction with the method of the present invention to control the planarization of wafer substrate 100. After undergoing the method of the present invention, wafer structure 100 is now ready for any additional process steps which may be necessary to create integrated circuits. This may include the addition of multiple patterned metallic layers, oxide layers, etc. which may also be planarized according to the method of the present invention. An example of planarizing a metal layer is described below. As before, the processes and methods of depositing and etching materials can be any method or process used in integrated circuit manufacturing known to those skilled in the art.

As described above, when using CMP processes to planarize a layered integrated circuit wafer, the oxide deposited over a metal structure with a higher pattern factor will typically polish more slowly than oxide deposited over a metal structure with a lower pattern factor. However, when a metal layer is deposited over a patterned oxide layer, the patterned oxide layer does not have a pattern factor in the exact same sense as a patterned metal layer. Instead of specific areas of isolated oxide, the patterned oxide layer remains a continuous layer with certain areas of the oxide layer being higher, or thicker, than other lower, or thinner, areas of the oxide layer. It is important to note that when polishing a metal layer, excess metal is being removed and the remaining metal will form parts of the integrated circuit such as metal lines, metal pads, etc. A uniform CMP polish rate across the entire surface of the metal layer will often result in excessive metal removal in certain areas, a phenomenon known as "dishing." Those areas which are most susceptible to dishing are the areas of the wafer surface which will subsequently have a higher density of metal patterns. Dishing can result in circuit failure if too much metal is removed during the CMP process. In addition, as before, the non-planar surface can also lead to problems with subsequent photolithography process steps. The method of the present invention can be adapted to control the CMP polish rate according to the pattern factor for a metal layer and can, therefore, reduce or eliminate dishing.

Figure 7:
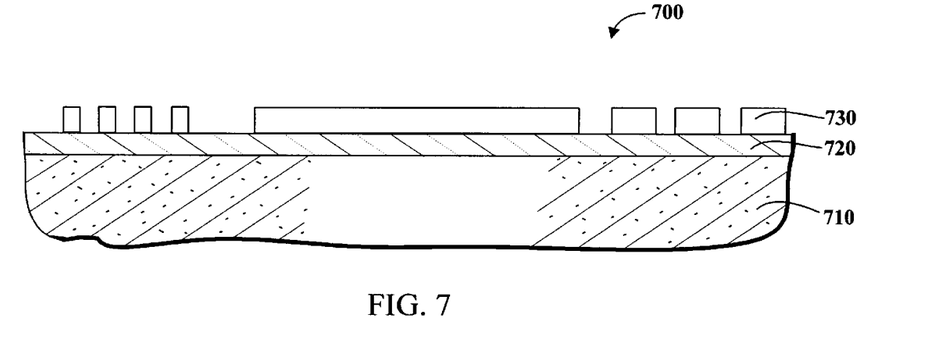
FIG. 7 is a side view of a semiconductor wafer ready for use with a preferred embodiment of the method of the present invention for planarizing a metal layer on the semiconductor wafer.

Referring now to FIG. 7, a wafer structure 700 for fabricating integrated circuits according to a second preferred embodiment of the method of the present invention includes: a substrate 710; a dielectric layer 720; and a patterned photoresist layer 730. Wafer structure 700 is a portion of an integrated circuit chip. Wafer structure 700 may be formed by using any of the integrated circuit fabrication methods or techniques known to those skilled in the art.

Substrate 710 is any substrate used to manufacture integrated circuits such as silicon, gallium arsenide, etc. Substrate 710 will typically contain integrated circuit components such as P-well and N-well transistor gates and many other circuit components (not shown) which are well known to those skilled in the art. Dielectric layer 720 is typically formed by depositing silicon dioxide, High Density Plasma (HDP) oxide, silicon nitride, or aluminum oxide or similar material on the surface of substrate 710 using chemical vapor deposition (CVD), Plasma Enhanced CVD (PECVD), sputtering or re-sputtering processes.

Photoresist layer 730 may be formed or deposited using any method known to those skilled in the integrated circuit fabrication art. The composition of photoresist layer 730 will be determined by the process selected and the type of integrated circuit being manufactured. After deposition, photoresist layer 730 has been exposed to an etching process to create a patterned layer as shown in FIG. 7. While herein described as reactive ion etching, the actual etching process used may be any integrated circuit fabrication or manufacturing etching process known to those skilled in the art. This would include laser etching, etc. In addition, the type of etching process used will also depend on the type of material used as photoresist layer 730.

Figure 8:
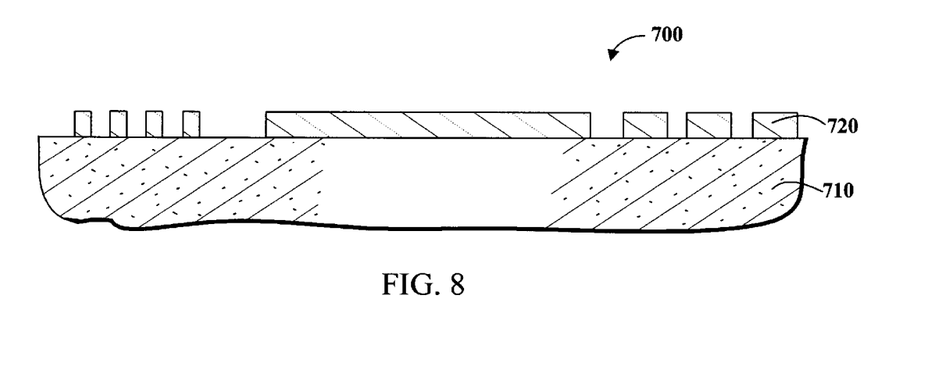
FIG. 8 is a view of the semiconductor wafer of FIG. 7 after patterning the oxide layer.

Referring now to FIG. 8, wafer structure 700 of FIG. 7 is shown after the pattern of photoresist layer 730 has been transferred to dielectric layer 720. The pattern has been transferred using standard integrated circuit photolithographic techniques. This might include exposing wafer structure 700 to a reactive ion etch process as described previously. As before, the areas of dielectric layer 720 not protected by photoresist layer 730 have been etched away. In addition, patterned photoresist layer 730 has also been removed, leaving dielectric layer 720 patterned as shown in FIG. 8.

Figure 9:
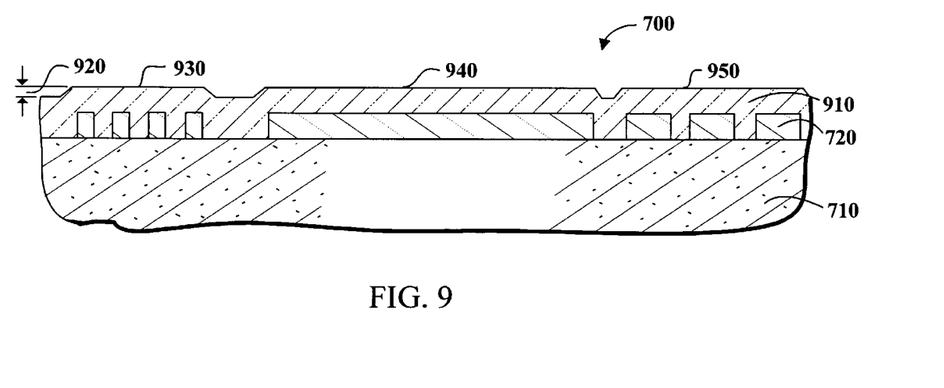
FIG. 9 is a view of the semiconductor wafer of FIG. 8 with a metal layer deposited over the patterned oxide layer.

Referring now to FIG. 9, wafer structure 700 of FIG. 8 is shown with a metallic layer 910 deposited over the surface of patterned dielectric layer 720. Metallic layer 910 is formed from any metal or metal alloys known to those skilled in the art such as aluminum copper alloys. Metallic layer 910 may be formed or deposited using any method known to those skilled in the art including sputtering or CVD processes. The examples presented previously for metallic layer 130 of FIG. 1 are applicable here as well. As shown in FIG. 9, the deposition of metallic layer 910 has created a non-planar surface on wafer structure 700 as indicated by a distance 920. Note that the non-planarity of the surface of metallic layer 910 is exaggerated for purposes of illustration. Distance 920 represents the difference between a lower area of the surface of metallic layer 910 and a higher area of metallic area. In addition, three different areas, area 930, area 940, and area 950 are shown in FIG. 9. During a typical CMP process without practicing the present invention, dishing will be more prevalent in area 930 than in areas 940 or 950. Further, dishing will also be more prevalent in area 950 than in area 940. However, by practicing the present invention as described below, the undesirable effects of dishing can be minimized or eliminated.

Figure 10:
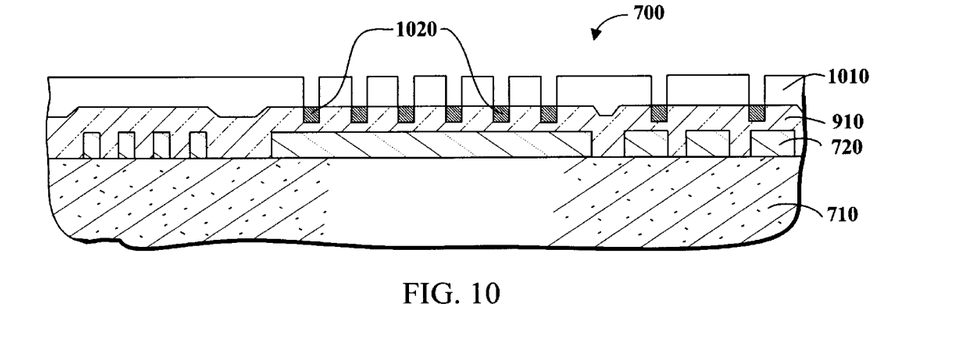
FIG. 10 is a view of the semiconductor wafer of FIG. 9 with a patterned photoresist layer deposited over the metal layer.

Referring now to FIG. 10, wafer structure 700 of FIG. 9 is shown with a patterned photoresist layer 1010 deposited over metallic layer 910. Photoresist layer 1010 may be formed or deposited using any method known to those skilled in the art. The photoresist materials and deposition processes vary significantly among the different manufacturers of integrated circuits. The method of the present invention is compatible with all current photoresist materials and deposition processes. The composition of photoresist layer 1010 will be determined by the integrated circuit manufacturer, the integrated circuit fabrication process selected, and the type of integrated circuit devices being manufactured.

After deposition, photoresist layer 1010 has been etched and patterned according to the pattern factor of the oxide structures underlying metallic layer 910. The etching process for photoresist layer 1010 is similar to that described for photoresist layer 310 above. The size, depth, number, and placement of the elements of the pattern developed in photoresist layer 1010 is determined by the pattern factor of the underlying structures as defined by patterned dielectric layer 720. Photoresist layer 1010 may be deposited and patterned by any method known to those skilled in the art. Metallic layer 910 is exposed in certain areas 1020 to an etching process. The etching process removes portions of metallic layer 910 which are not protected by patterned photoresist layer 1010. Areas 1020 not protected by patterned photoresist layer 1010 will become the vias or openings in metallic layer 910 which will alter the CMP polishing rates later in the fabrication process. While the etching process is typically a reactive ion etching process, the actual etching process used may be any integrated circuit fabrication or manufacturing etching process known to those skilled in the art. This would include laser etching, etc. In addition, the type of etching process used will also depend on the type of material used in forming photoresist layer 1010. The duration of the etch process will be determined by the amount of material to be removed from the surface of metallic layer 910.

Figure 11:
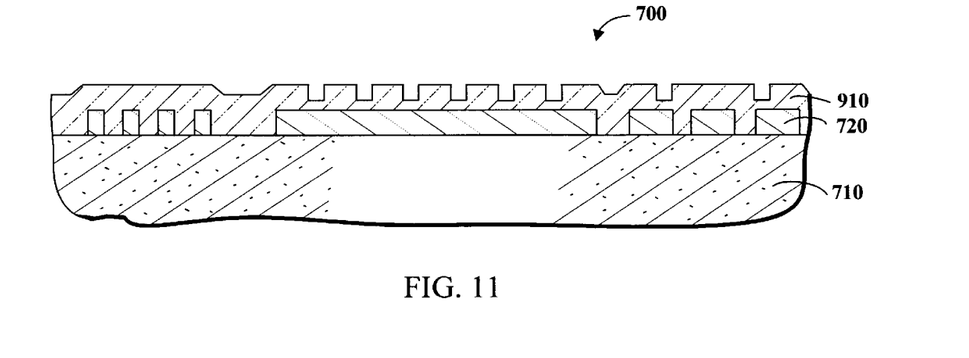
FIG. 11 is a view of the semiconductor wafer of FIG. 10 after patterning the metal layer.

Referring now to FIG. 11, wafer structure 700 of FIG. 10 is shown with the surface of metallic layer 910 patterned and ready for the actual CMP planarization process. The portions of photoresist layer 1010 not removed by the previous patterning process described above are now removed by using a base solution, a plasma removal process or any other method or technique known to those skilled in the art. At this point in the process (FIG. 11), photoresist layer 1010 has been completely removed from the surface of metallic layer 910. The surface of metallic layer 910 is patterned according to the pattern factor of the underlying oxide structures. The patterned portions of the surface of metallic layer 910 will now polish at a faster rate than the unpatterned portions of the surface of metallic layer 910.

As shown in FIG. 11, a greater number of openings in the overlying metal layer 910 above the relatively wider width dielectric structures are etched than the number of openings etched in the overlying metal layer 910 above the relatively narrower width dielectric structures.

Figure 12:
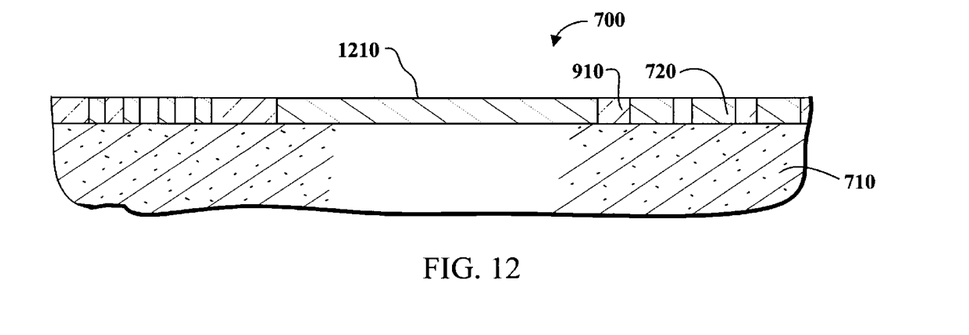
FIG. 12 is a view of the semiconductor wafer of FIG. 11 after undergoing a CMP process.

Referring now to FIG. 12, wafer structure 700 of FIG. 11 is shown after the CMP planarizing process has been performed on metallic layer 910. The CMP planarization process has produced planar surface 1210. After undergoing the method of the present invention, wafer structure 700 is now ready for any additional process steps which may be necessary to create integrated circuits. This may include the addition of multiple patterned metallic layers, oxide layers, etc. which may also be planarized according to the method of the present invention.

While the examples given above provide the general application of the present invention, a specific example will be given to further illustrate the details of the present invention. In a patterned metal layer, a wiring pattern is formed with metal lines on the order of 0.5 microns in width and several hundred microns in length. These lines are considered to be "isolated" lines. Isolated, in this context, means that the lines are separated from any other metal structure by at least one hundred microns in any direction perpendicular to the length of the metal line.

In another area of the chip, there is a metal maze which is an array of metal shapes. The array is in the shape of a square, and covers a surface area of approximately thirty square millimeters. The array might be comprised of a straight line/space array with line and spaces both equal to 0.5 microns. An oxide layer is deposited over the surface of the entire patterned metal layer using standard plasma enhanced CVD techniques, to a planar thickness of 1.5 microns. A photoresist layer is then deposited over the oxide layer to a planar thickness of 1 micron and the surface of the photoresist layer is selectively patterned. The photoresist layer is not patterned at all over the isolated lines. Over the metal maze, the photoresist layer is patterned with a series of holes 3 microns in diameter. The holes are spaced regularly in both the x and y directions with equal spacing in both directions. The holes are placed close enough together so that the overall pattern factor of the photoresist layer is 50%. The pattern of holes is transferred to the oxide layer using a reactive ion etch process with a timed etch step. The duration of the etch step is timed so that the holes of the pattern are etched to a depth of 0.5 microns and then the remainder of the photoresist layer is stripped. The wafer is then processed by a standard CMP procedure to planarize the surface of the oxide layer. The CMP process will reduce the thickness of the oxide layer to a nominal 0.5 microns as measured over a large square metal pad that measures approximately 100 microns on a side.

After the CMP process has been completed, it is anticipated that the thickness of the oxide layer over a line in the middle of the metal maze and the thickness of the oxide layer over an isolated line will be more closely matched than if the invention had not been used. It should be appreciated that the exact placement of the elements of the pattern and the depth of the pattern will vary significantly based on the steps and materials used in the process. Proper adjustment of the photoresist pattern and the oxide etch depth may be optimized for each unique application.

As demonstrated through the examples presented above, the method of the present invention can significantly reduce or eliminate the integrated circuit fabrication processing problems associated with pattern factor effects. The method of the present invention provides a way to selectively control the polishing rate over different areas of an integrated circuit wafer during the CMP process. The present invention allows for enhanced material removal rates where desired, resulting in more effective planarization of the wafer surface and increased yield rates.

While the present invention has been particularly shown and described with reference to preferred embodiments thereof, it will be understood by those skilled in the art that various changes in form and details may be made therein without departing from the spirit and scope of the invention.

What is claimed is:

1. A method of removing excess material from and planarizing a dielectric layer deposited over a patterned metal layer on a semiconductor wafer, the patterned metal layer having a plurality of metal structures and having a plurality of gaps between adjacent metal structures, the dielectric layer filling the gaps between adjacent metal structures and overlying the plurality of metal structures, the method comprising the steps of:

etching a plurality of openings in the overlying dielectric layer to form a pattern on the surface of the overlying dielectric layer, wherein the step of etching a plurality of openings comprises etching a greater number of openings in the overlying dielectric wider width above relatively larger metal structures than the number of openings etched in the overlying dielectric layer above relatively narrower width metal structures; and planarizing the surface of the etched overlying dielectric layer by using a chemical mechanical polishing process.

2. A method of removing excess material from and planarizing a metal layer deposited over a patterned dielectric layer on a semiconductor wafer, the patterned dielectric layer having a plurality of dielectric structures and having a plurality of gaps between adjacent dielectric structures, the dielectric layer filling the gaps between adjacent dielectric structures and overlying the plurality of dielectric structures, the method comprising the steps of:

etching a plurality of openings in the overlying metal layer to form a pattern on the surface of the overlying metal layer, wherein the step of etching a plurality of openings comprises etching a greater number of openings in the overlying metal layer above relatively wider width dielectric structures than the number of openings etched in the metal layer above relatively narrower width dielectric structures; and planarizing the surface of the etched overlying metal layer by using a chemical mechanical polishing process.

* * * * *